(12) United States Patent
Lung (10) Patent No.: US 7,829,876 B2
(45) Date of Patent: Nov. 9, 2010

(54) VACUUM CELL THERMAL ISOLATION FOR A PHASE CHANGE MEMORY DEVICE

(75) Inventor: Hsiang Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 237 days.

(21) Appl. No.: 11/408,598

(22) Filed: Apr. 21, 2006

(65) Prior Publication Data

US 2007/0126040 A1    Jun. 7, 2007

Related U.S. Application Data

(60) Provisional application No. 60/739,079, filed on Nov. 21, 2005.

(51) Int. Cl.
*H01L 21/00* (2006.01)

(52) U.S. Cl. .................................. 257/2; 257/E45.002

(58) Field of Classification Search ........... 257/E45.002
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |

(Continued)

FOREIGN PATENT DOCUMENTS

WO    WO 00/45108 A1    8/2000

(Continued)

OTHER PUBLICATIONS

Gibson, G.A. et al., "Phase-change Recording Medium that Enables Ultrahigh-density Electron-beam Data Storage," Applied Physics Letter, 2005, 3 pp., vol. 86.

(Continued)

*Primary Examiner*—Howard Weiss
(74) *Attorney, Agent, or Firm*—James F. Hann; Haynes Beffel & Wolfeld LLP (57) ABSTRACT

A memory device with improved thermal isolation. The memory cell includes a first electrode element, having an upper surface; an insulator stack formed on the first electrode element, including first, second and third insulating members, all generally planar in form and having a central cavity formed therein and extending therethrough, wherein the second insulator member is recessed from the cavity; a phase change element, generally T-shaped in form, having a base portion extending into the cavity to make contact with the first electrode element and making contact with the first and third insulating members, and a crossbar portion extending over and in contact with the third insulating member, wherein the base portion of the phase change element, the recessed portions of the second insulating member and the surfaces of the first and third insulating members define a thermal isolation void; and a second electrode formed in contact with the phase change member.

7 Claims, 5 Drawing Sheets

U.S. PATENT DOCUMENTS

| | | |
|---|---|---|
| 5,177,567 A | 1/1993 | Klersy et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,304 B2 | 5/2005 | Moore |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,164,147 B2 | 1/2007 | Lee et al. |
| 7,166,533 B2 | 1/2007 | Happ |
| 7,214,958 B2 | 5/2007 | Happ |
| 7,220,983 B2 | 5/2007 | Lung |
| 7,238,959 B2 * | 7/2007 | Chen .......................... 257/2 |
| 7,262,502 B2 * | 8/2007 | Chang ...................... 257/758 |
| 2002/0070457 A1 | 6/2002 | Sun et al. |
| 2002/0072223 A1 | 6/2002 | Gilbert et al. |
| 2002/0113273 A1 | 8/2002 | Hwang et al. |
| 2004/0051094 A1 | 3/2004 | Ooishi |
| 2004/0178172 A1 | 9/2004 | Huang et al. |
| 2004/0248339 A1 | 12/2004 | Lung |
| 2005/0029502 A1 | 2/2005 | Hudgens |
| 2005/0062087 A1 | 3/2005 | Chen et al. |
| 2005/0093022 A1 | 5/2005 | Lung |
| 2005/0106919 A1 | 5/2005 | Layadi et al. |
| 2005/0130414 A1 | 6/2005 | Choi et al. |
| 2005/0167656 A1 | 8/2005 | Sun et al. |
| 2005/0201182 A1 | 9/2005 | Osada et al. |
| 2005/0212024 A1 | 9/2005 | Happ |
| 2005/0215009 A1 | 9/2005 | Cho |
| 2005/0285096 A1 | 12/2005 | Kozicki |
| 2006/0091476 A1 | 5/2006 | Pinnow et al. |
| 2006/0108667 A1 | 5/2006 | Lung |
| 2006/0110878 A1 | 5/2006 | Lung et al. |
| 2006/0118913 A1 | 6/2006 | Yi et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0010054 A1 | 1/2007 | Fan et al. |

| | | | |
|---|---|---|---|
| 2007/0030721 A1 | 2/2007 | Segal et al. | |
| 2007/0037101 A1 | 2/2007 | Morioka | |
| 2007/0096162 A1 | 5/2007 | Happ et al. | |
| 2007/0108077 A1 | 5/2007 | Lung et al. | |
| 2007/0108429 A1 | 5/2007 | Lung | |
| 2007/0108430 A1 | 5/2007 | Lung | |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0131980 A1 | 6/2007 | Lung | |
| 2007/0138458 A1 | 6/2007 | Lung | |
| 2007/0147105 A1 | 6/2007 | Lung et al. | |
| 2007/0154847 A1 | 7/2007 | Chen et al. | |
| 2007/0155172 A1 | 7/2007 | Lai et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0173019 A1 | 7/2007 | Ho et al. | |
| 2007/0173063 A1 | 7/2007 | Lung | |
| 2007/0176261 A1 | 8/2007 | Lung | |
| 2007/0187664 A1 | 8/2007 | Happ | |
| 2007/0235811 A1 | 10/2007 | Furukawa et al. | |
| 2007/0257300 A1 | 11/2007 | Ho et al. | |
| 2007/0298535 A1 | 12/2007 | Lung | |
| 2008/0014676 A1 | 1/2008 | Lung et al. | |

FOREIGN PATENT DOCUMENTS

| | | | |
|---|---|---|---|
| WO | WO 00/79539 A1 | 12/2000 | |
| WO | WO 01/45108 A1 | 6/2001 | |

OTHER PUBLICATIONS

Happ, T.D. et al., "Novel None-Mask Self-Heating Pillar Phase Change Memory," 2006 Symposium on VLSI Technology, 2 pp.
Hudgens, S. et al., "Overview of Phase-Change Chalcogenide Nonvolatile Memory Technology," MRS Bulletin, Nov. 2004, pp. 829-832.
"Magnetic Bit Boost," www.sciencenews.org <http://www.sciencenews.org>, Dec. 18 & 25, 2004, p. 389, vol. 166.
"New Memories Tap Spin, Gird for Battle," Science News, Apr. 3, 1999, p. 223, vol. 155.
Pirovano, Agostino et al., "Reliability Study of Phase-Change Nonvolatile Memories," IEEE Transactions on Device and Materials Reliability, Sep. 2004, pp. 422-427, vol. 4, No. 3.
Radaelli, A. et al., "Electronic Switching Effect and Phase-Change Transition in Chalcogenide Materials," IEEE Electron Device Letters, Oct. 2004, pp. 684-686, vol. 25, No. 10.
"Remembering on the Cheap," www.sciencenews.org <http://www.sciencenews.org>, Mar. 19, 2005, p. 189, vol. 167.
Wuttig, Matthias, "Towards a Universal Memory?" Nature Materials, Apr. 2005, pp. 265-266, vol. 4.
Ahn, S. J. et al., "Highly Reliable 5nm Contact Cell Technology for 256Mb PRAM," VLSI Technology, Digest of Technical Papers, Jun. 14-16, 2005, pp. 98-99.
Adler, David, "Amorphous-Semiconductor Devices," Sci. Amer., vol. 236, pp. 36-48, May 1977.
Adler, D. et al., "Threshold Switching in Chalcogenide-Glass Thin Films," J. Appl/ Phys 51(6), Jun. 1980, pp. 3289-3309.
Ahn, S.J. et al., "A Highly Manufacturable High Density Phase Change Memory of 64 Mb and Beyond," IEEE IEDM 2004, pp. 907-910.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory," AFIT/GE/ENG/00M-04, Mar. 2000, 121 pages.
Chen, AN et al., "Non-Volatile Resistive Switching for Advanced Memory Applications," IEEE IEDM , Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al. "An Edge Contact Type Cell fro Phase Change RAM Featuring Very Low Power Consumption," 2003 Symposium on VLSI Technology Digest of Technical Papers, pp. 175-176.
Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.
Horii, H. et al., "A Novel Cell Technology Using N-doped GeSbTe Films for Phase Change RAM," 2003 Symposium on VLSI Technology Digest of Technical Papers, pp. 177-178.
Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE $43^{rd}$ Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L.; "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era- vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1988, pp. 21-26.

* cited by examiner

VACUUM CELL THERMAL ISOLATION FOR A PHASE CHANGE MEMORY DEVICE

REFERENCE TO RELATED APPLICATION

This application claims the benefit of U.S. Provisional Patent Application No. 60/739,079 entitled "Improved Thermal Isolation for an Active-Sidewall Phase Change Memory Cell" filed on Nov. 21, 2005. That application is incorporated by reference for all purposes.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates generally to memory devices and more specifically to memory devices employing phase change element to store information.

2. Description of Related Art

Phase change based memory materials are widely used in read-write optical disks, and such materials are seeing increasing use in computer memory devices. These materials have at least two solid phases, including for example a generally amorphous solid phase and a generally crystalline solid phase. Laser pulses are used in read-write optical disks to switch between phases and to read the optical properties of the material after the phase change, and electrical pulses are employed in the same manner in computer memory devices.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000, and Reinberg, "Chalcogenide Memory Cell with a Plurality of Chalcogenide Electrodes," U.S. Pat. No. 5,920,788, issued Jul. 6, 1999.

A specific issue arising from conventional the phase change memory and structures is the heat sink effect of conventional designs. Generally, the prior art teaches the use of metallic electrodes on both sides of the phase change memory element, with electrodes of approximately the same size as the phase change member. Such electrodes act as heat sinks, the high heat conductivity of the metal rapidly drawing heat away from the phase change material. Because the phase change occurs as a result of heating, the heat sink effect results in a requirement for higher current, in order to effect the desired phase change.

One approach to the heat flow problem is seen in U.S. Pat. No. 6,815,704, entitled "Self Aligned Air-Gap Thermal Insulation for Nano-scale Insulated Chalcogenide Electronics (NICE) RAM", in which an attempt is made to isolate the memory cell. That structure, and the attendant fabrication process, is overly complex, yet it does not promote minimal current flow in the memory device.

It is desirable therefore to provide a memory cell structure having small dimensions and low reset currents, as well as a structure that addresses the heat conductivity problem, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

An important aspect of the claimed invention is a memory device with improved thermal isolation. The memory cell includes a first electrode element, having an upper surface; an insulator stack formed on the first electrode element, including first, second and third insulating members, all generally planar in form and having a central cavity formed therein and extending therethrough, wherein the second insulator member is recessed from the cavity; a phase change element, generally T-shaped in form, having a base portion extending into the cavity to make contact with the first electrode element and making contact with the first and third insulating members, and a crossbar portion extending over and in contact with the third insulating member, wherein the base portion of the phase change element, the recessed portions of the second insulating member and the surfaces of the first and third insulating members define a thermal isolation void; and a second electrode formed in contact with the phase change member.

DETAILED DESCRIPTION

Figure 1:
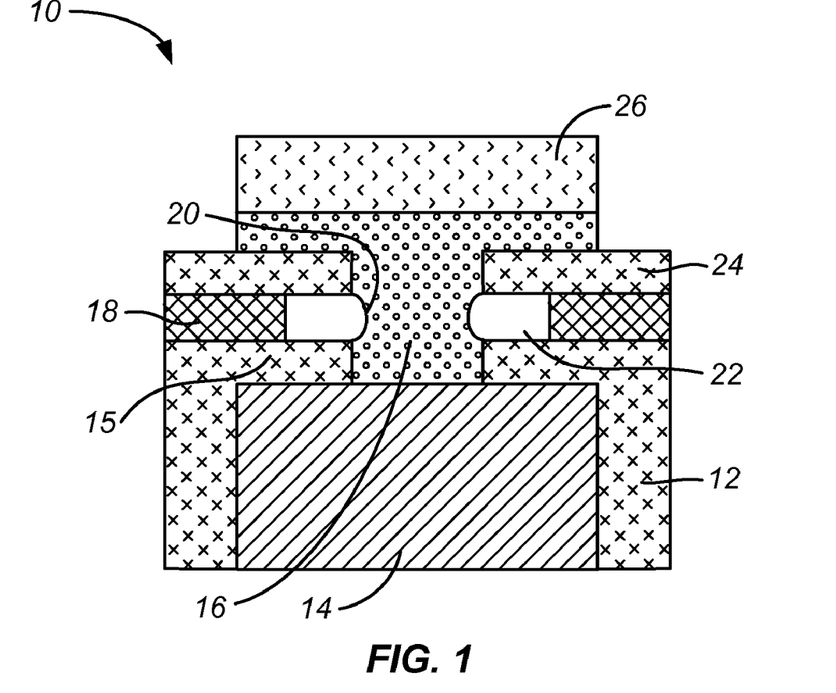
FIG. 1 is a cross-sectional view that illustrates an embodiment of a phase change memory element employing a vacuum cell thermal isolation element.
Figure 1A:
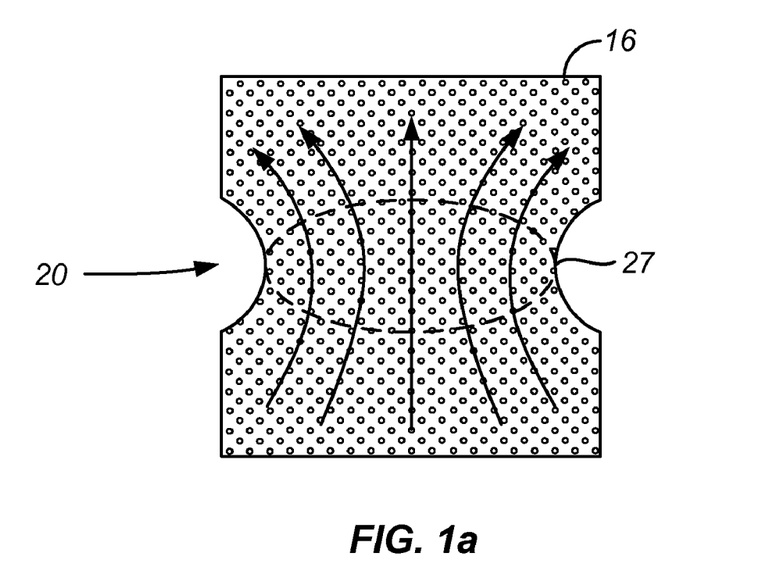
FIG. 1a illustrates a current path in a phase change memory element as shown in FIG. 1.

The following discussion describes embodiments of the invention with particular reference to FIGS. 1-3. It will be understood that the examples and features shown are exemplary and illustrative in nature and not intended to limit the scope of the invention. That scope is defined solely by the claims appended hereto.

The present invention concerns memory elements and memory cells. As used herein, and as is well known in the art, a memory cell is a circuit device designed to hold a charge or state to indicate the logic level of a single data bit. Memory cells are arrayed to provide, for example, the random access memory for a computer. Within certain memory cells, a memory element performs the function of actually holding the charge or state. In a conventional dynamic random access memory cell, for example, a capacitor indicates the logic level of the cell, with a fully charged state indicating a logic 1, or high, state, and fully discharged indicating a logic 0, or low, state.

A memory element 10, an embodiment of the present invention, is illustrated generally in FIG. 1. As seen there, the memory element 10 is shown as a single unit, for purposes of clarity. In practice, each element is a part of a memory cell, which in turn is part of a larger memory array, as discussed more fully below. The structure of a memory element will be discussed first, followed by a description of the process for fabricating the same.

The memory element is formed on a substrate 12, which is preferably a dielectric fill material such as silicon dioxide. Substrate material surrounds and extends over the lower electrode 14, including an upper ledge 15 lying over the top of the lower electrode 14. The lower electrode 14 preferably is formed from a refractory metal such as tungsten, and it is formed in the oxide layer. Other suitable refractory metals include Ti, Mo, Al, Ta, Cu, Pt, Ir, La, Ni, and Ru, as well as oxides and nitrides of such materials. For example, materials such as TiN, RuO or NiO are known and effective refractory metals.

Above the lower electrode and in contact with it is a phase change element 16, generally having a T-shape, with the upright portion in contact with and extending vertically from the lower electrode, through the substrate upper ledge 15 overlying the lower electrode. An upper electrode 26 is formed atop the crossbar portion of the phase change element.

The phase change element 16 can be formed from a class of materials preferably including chalcogenide based materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide combinations denote chalcogenides amalgamated with other materials such as transition metals. A chalcogenide combination usually contains one or more elements from group IV of the periodic table of elements, such as germanium (Ge) and tin (Sn). Often, chalcogenide combinations include one or more of antimony (Sb), gallium (Ga), indium (In), and silver (Ag). Many phase change based memory materials have been described in technical literature, including combinations of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te materials, a wide range of compositions may be workable. The compositions can be characterized as $Te_a Ge_b Sb_{100-(a+b)}$.

One researcher has described the most useful combinations as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular combinations evaluated by another researcher include Ge2Sb2Te5, GeSb2Te4 and GeSb4Te7. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or combinations thereof may be combined with Ge/Sb/Te to form a phase change material that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These materials are at least bistable. The term amorphous is used to refer to a relatively less ordered structure, more disordered than a single crystal, which has detectable characteristics, such as higher electrical resistivity than the crystalline phase. The term crystalline is used to refer to a structure relatively more ordered than in an amorphous state, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change combination. In following sections of the disclosure, the phase change material is referred to as GST, and it will be understood that other types of phase change materials can be used. A material useful for implementation of a phase change element described herein is $Ge_2 Sb_2 Te_5$.

Between the lower electrode and the crossbar of the phase change element lie three dielectric layers. Immediately above the lower electrode is the substrate upper ledge 15, as described above. Atop and formed on the upper ledge is an intermediate dielectric layer 18. Formed on the intermediate dielectric layer, and extending into contact with the lower surface of the phase change element, is an upper dielectric layer 24. The upper dielectric layer is preferably composed of the same, or similar, material as the substrate, such as silicon dioxide, while the intermediate dielectric is preferably formed of SiN or a similar material.

The upper ledge and upper dielectric layer make contact with the upright portion of the phase change element. The intermediate dielectric layer, however, does not extend to the phase change element, but rather that layer is recessed, so that vacuum isolation cell 22 is defined by the end of the intermediate dielectric layer and the upright portion of the phase change element, on one axis, and the upper ledge and upper dielectric layer on the other. This chamber preferably contains a vacuum, and it provides improved thermal isolation for the phase change element. In the area adjacent the vacuum isolation cell, the upright portion of the phase change element is pinched to form neck 20, a zone of reduced cross-sectional area.

In operation, current flows through the memory element from lower electrode 14, into the phase change element 16, and out through the upper electrode 26. Of course, the current direction could be altered by changes in element geometry, as will be understood by those in the art. In either event, the phase change material is subject to joule heating as current flows, as discussed above, resulting in a temperature rise in the center of the GST material. When the temperature exceeds the level required for phase change, a portion of the phase change material changes state. Temperature is not uniform throughout the phase change element, with changing values of current density producing significant variations. The temperature of the phase change material determines the effect produced, so the current is chosen to produce a temperature sufficient to create the desired result—either an amorphous state or a crystalline state—in the GST material. If it is desired to read the element status, a low current is employed for sensing purposes. The read operation is non-destructive, as the element temperature is kept below the threshold for a phase change.

The vacuum isolation cell 22 functions to contain heat within the phase change element, which has several positive effects. First, by preventing the migration of heat away from the phase change element, this design reduces the total heat required to effect phase changes, which in turn reduces the current required for each SET or RESET operation. At the same time, retaining heat within the phase change element reduces the heat transferred to the remainder of the memory array, which translates directly into increased lifespan for the device. Given the vast numbers of memory elements within a complete integrated circuit—at least eight billion elements for a 1 GB memory device, for example—it can be appreciated that the effects of such a heat reduction will be significant. The efficiency of the phase change element is further enhanced by concentrating the current within the phase change element, in the area of neck 20. This effect is shown in the detail view of FIG. 1a, in which arrows Iin enter from electrode 14 (not shown) with a relatively uniform current density, but are concentrated at the contact with contact element 30, producing an area 27 of high temperature, which with proper current selection leads to a phase change in that area. The illustrated design leads to reduced current consumption by the memory element.

Memory element 10 is subject to a number of variations as seen in FIGS. 2a-2f. These variations do not affect the overall performance, function or design of memory element 10, but they do produce changes in specific performance parameters or manufacturability, as will be understood by those of skill in the art. Discussions of the following variations each take the memory element 10 of FIG. 1 as a starting point.

Figure 2A:
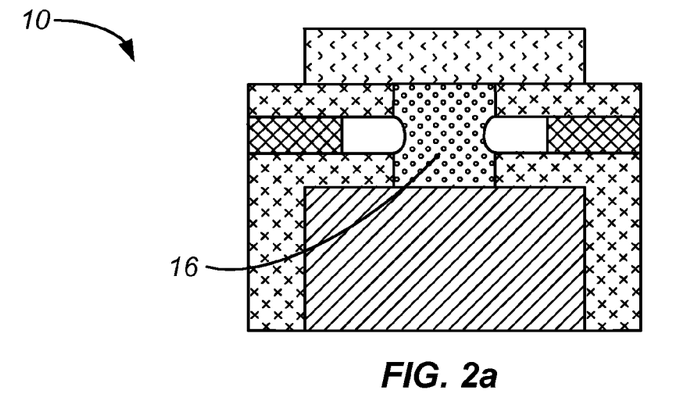
FIGS. 2a-2f illustrate alternative embodiments to the phase change memory element of FIG. 1.
Figure 2B:
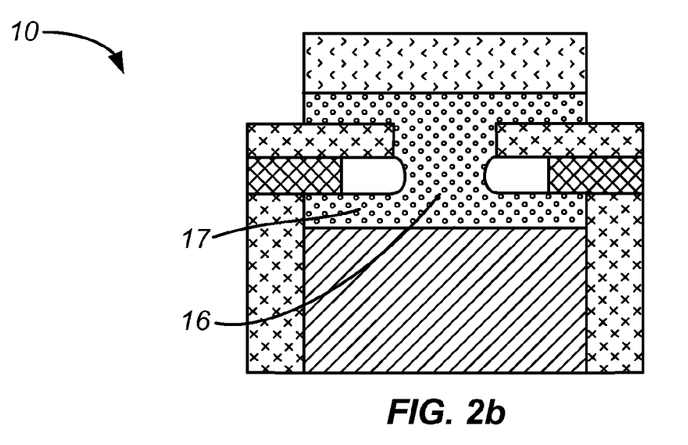

The variation shown in FIG. 2a, removes the crossbar portion of the phase change element, leaving an hourglass-shaped element that extends to the upper surface of the upper dielectric layer. The advantage of this design is improved fabrication, as the layer of GST material above the upper dielectric layer is dispensed with. Better thermal isolation, The variation of FIG. 2b adds a bottom flange 17 to the phase change element, producing an element resembling an I-beam in outline. This design provides improved thermal isolation between the central portion of the phase change element and the bottom electrode.

Figure 2C:
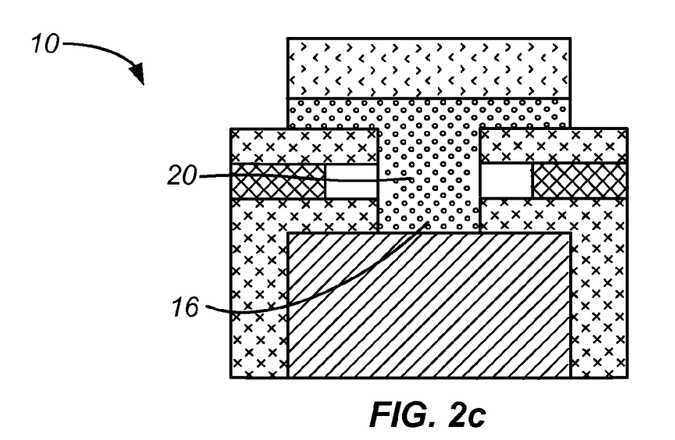

In FIG. 2c the neck 20 is not formed, leaving the upright portion of the phase change element as a straight member. This change clearly simplifies the manufacturing process.

Figure 2D:
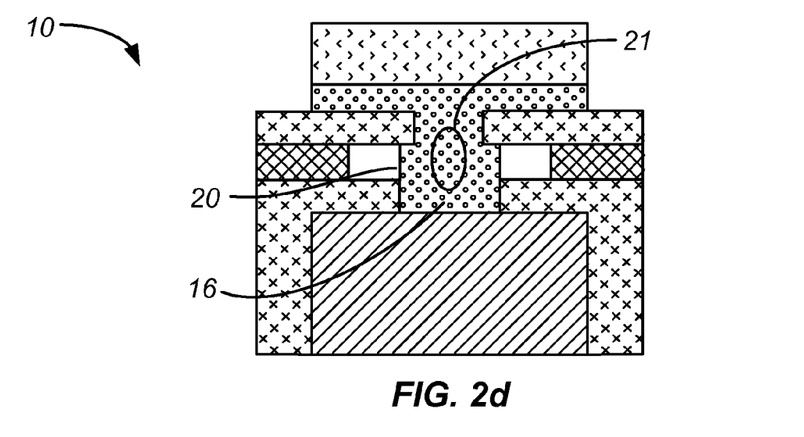

The variation of FIG. 2d moves in the opposite direction. Here the neck 20 is held straight, but a void 21 is formed inside the upright member. It can clearly be seen that this design constricts the current flow path even more than does the design of FIG. 1, producing more concentrated heating. Also, the void 21 also increases the degree of thermal isolation, serving the concentrate the heat even more. It is preferred to deposit this material by a sputtering process, and the internal void 21 is formed by controlling sputtering conditions, as is known in the art.

Figure 2E:
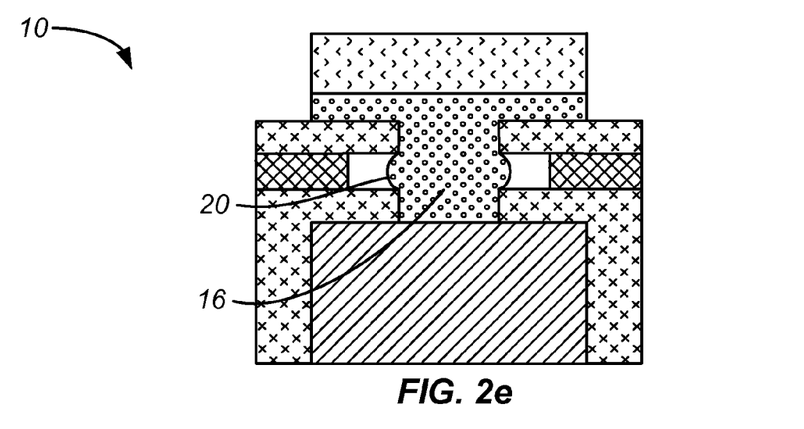

The variation of FIG. 2e includes a neck 20 formed the opposite of the neck shown in FIG. 1. Rather than having a reduced cross-sectional area, the neck here has an increased cross-section, protruding into the vacuum isolation cell, as result of the deposition process.

Figure 2F:
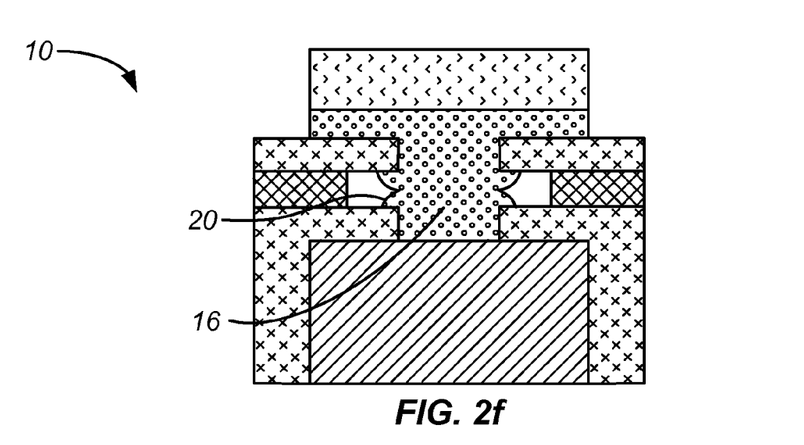

Similarly, FIG. 2f depicts a design in which the neck 20 protrudes into the vacuum isolation cell, but the protrusion is notched.

Figure 3A:
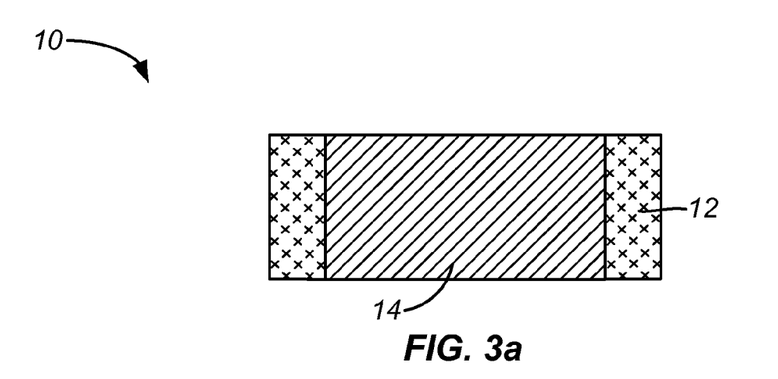
FIGS. 3a-3f illustrate a process for fabricating the phase change memory element as shown in FIG. 1.

An embodiment of a process for fabricating the memory element 10 depicted in FIG. 1 is illustrated in FIGS. 3a-3f. The process begins with a substrate 12, as shown in FIG. 3a. A lower electrode 14 is formed in the substrate, using known techniques. The materials for both the substrate and the electrode are discussed above.

Figure 3B:
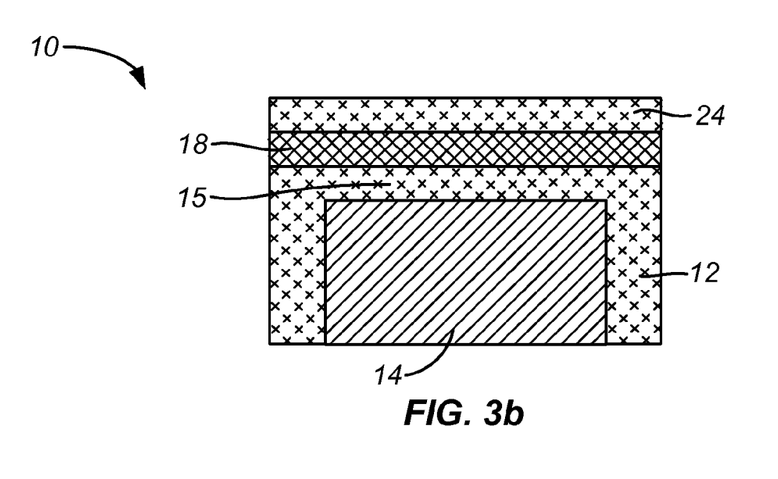

Next, as seen in FIG. 3b, a substrate upper ledge 15, plus layers of an intermediate dielectric 18 and an upper dielectric 24 are formed across the width of the substrate. Each of these layers has a thickness of from about 10 nm to about 50 nm, preferably 30 nm.

Figure 3C:
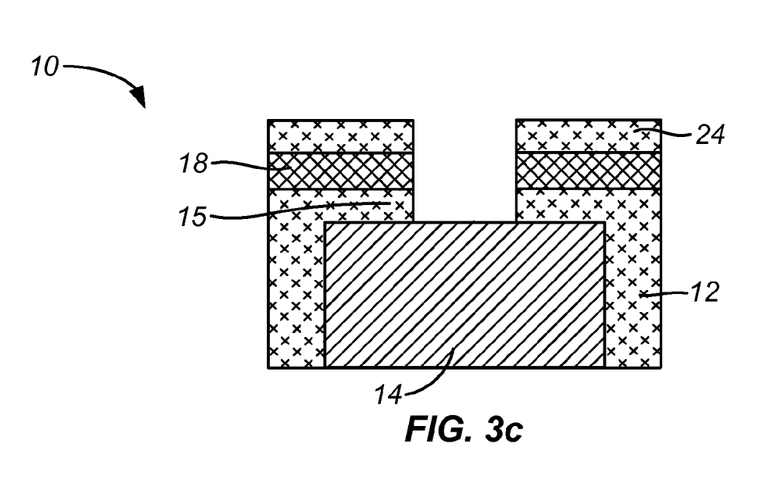

Removal of material to prepare for the phase change element is seen in FIG. 3c. It is preferred to follow the conventional lithographic process of applying a photoresistive film; imprinting a pattern, as through a mask or reticle; exposing the pattern to visible light or other radiation; stripping the undesired portions of resist material to form an etch mask; and etching the material layers. It is preferred to employ a dry, anisotropic etch, which may be controlled with an optical device that senses arrival at the lower electrode layer.

Figure 3D:
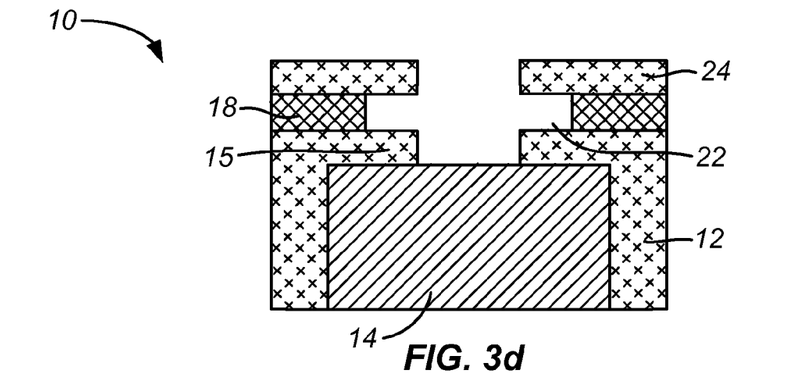

The vacuum isolation cell is formed in the step shown in FIG. 3d, where a wet etch, preferably phosphorous acid, is employed to selectively etch the SiN of the intermediate dielectric layer 18 a controlled distance back from the surface formed by the ends of the substrate upper ledge 15 and the upper dielectric layer 24.

Figure 3E:
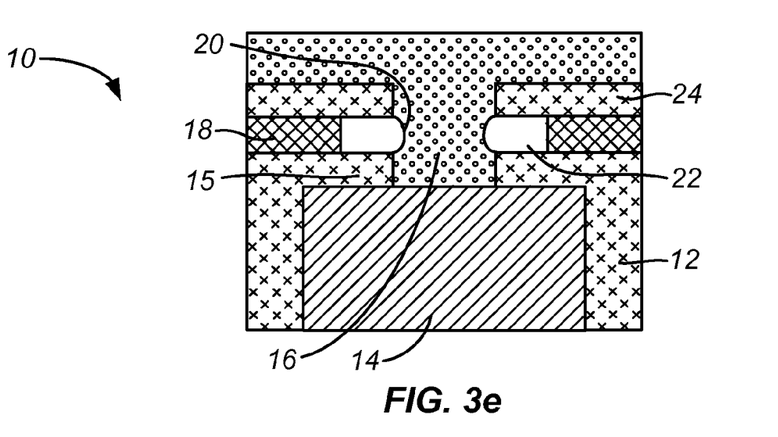

Phase change element 16 is added in the following step, illustrated in FIG. 3e. As shown, a conventional deposition step, preferably employing a sputtering or plasma enhanced sputtering process, is employed to form the phase change element 16. The width of the upright portion of the phase change element (which is also the width of the etched area) should be from about 10 nm to about 100 nm, preferably 50 nm.

Figure 3F:
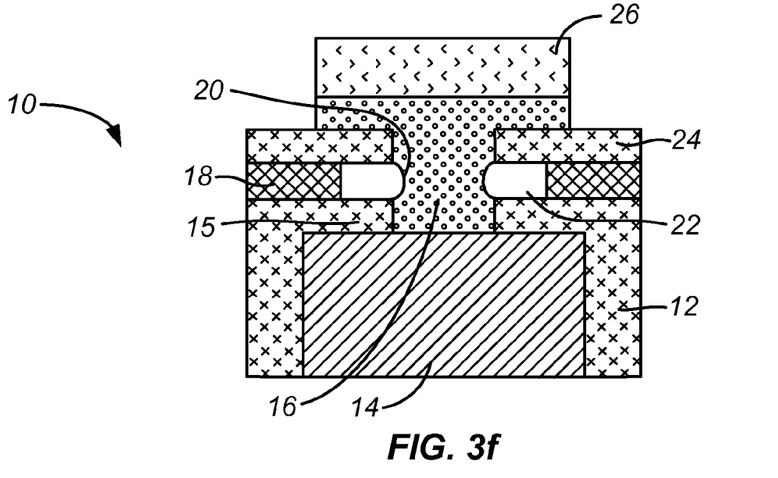

Finally, the upper electrode 26 is deposited in the final step, shown in FIG. 3f. That element and the phase change element are patterned to the desired lateral dimension, using conventional lithographic techniques as discussed above.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a first electrode element, having a first, generally planar surface;
   an insulator stack formed on the first electrode element, including first, second and third insulating members, all generally planar in form and having a central cavity formed therein and extending therethrough, wherein the second insulator member comprises a portion recessed from the cavity;
   the central cavity opening onto a first portion of the first, generally planar surface;
   a phase change element extending into the cavity to make direct physical contact with the first electrode element only at the first, generally planar surface of the first electrode element;
   the phase change element also making contact with the first and third insulating members;
   the phase change element, the recessed portion of the second insulating member and the surfaces of the first and third insulating members define a thermal isolation void fully surrounding a section of the phase change element;
   a second electrode element having a second, generally planar surface in contact with the phase change element; and
   the second generally planar surface being opposite to the first generally planar surface with all of the second electrode element positioned over the first electrode element.

2. The device of claim 1, wherein the phase change element comprises a combination of Ge, Sb, and Te.

3. The memory device of claim 1, wherein the phase-change element comprises a combination of two or more materials from the group of Ge, Sb, Te, Se, In, Ti, Ga, Bi, Sn, Cu, Pd, Pb, Ag, S, and Au.

4. The memory device of claim 1, wherein the phase-change element is generally T-shaped in form, with a crossbar member atop the third insulating member and a central portion extending into the cavity.

5. The memory device of claim 4, wherein the crossbar member has a generally planar crossbar surface engaging the second surface portion.

6. The memory device of claim 1, wherein the phase-change element is generally I-shaped in form, with a crossbar member atop the third insulating member and a central portion extending into the cavity, and a base member lying below the first insulating member.

7. The memory device of claim 1, wherein the section of the phase-change element has a reduced cross-sectional area.

* * * * *